United States Patent
Yi et al.

(10) Patent No.: US 10,134,941 B2
(45) Date of Patent: Nov. 20, 2018

(54) METHOD FOR MANUFACTURING SOLAR CELL INCLUDING A PATTERNED DOPANT LAYER

(71) Applicant: LG ELECTRONICS INC., Seoul (KR)

(72) Inventors: Mann Yi, Seoul (KR); Jeongkyu Kim, Seoul (KR); Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/997,196

(22) Filed: Jan. 15, 2016

(65) Prior Publication Data

US 2016/0211403 A1    Jul. 21, 2016

(30) Foreign Application Priority Data

Jan. 16, 2015    (KR) .................. 10-2015-0007896

(51) Int. Cl.
  *H01L 31/18* (2006.01)
  *H01L 31/0216* (2014.01)
  *H01L 31/068* (2012.01)

(52) U.S. Cl.
  CPC ........ *H01L 31/18* (2013.01); *H01L 31/02167* (2013.01); *H01L 31/02168* (2013.01);
  (Continued)

(58) Field of Classification Search
  CPC ............... H01L 31/18; H01L 31/02167; H01L 31/02168; H01L 31/068; H01L 31/1804;
  (Continued)

(56) References Cited

U.S. PATENT DOCUMENTS

2006/0019039 A1*  1/2006  Hanawa ............... C23C 14/046
                                                               427/523
2009/0205712 A1*  8/2009  Cousins .............. H01L 31/0236
                                                               136/261

(Continued)

FOREIGN PATENT DOCUMENTS

DE    102013209669 A1    11/2014
DE    102013210092 A1    12/2014
(Continued)

OTHER PUBLICATIONS

Ryu et al., "High efficiency large area n-type front junction silicon solar cells with boron emitter formed by screen printing technology," Progress in Photovoltaics: Research and Applications, vol. 23, Apr. 1, 2014, 5 pages

*Primary Examiner* — Brigitte Paterson
(74) *Attorney, Agent, or Firm* — Birch, Stewart, Kolasch & Birch, LLP

(57) ABSTRACT

A method for manufacturing a solar cell is disclosed. The disclosed method includes conductive region formation of forming a first-conduction-type region at one surface of a semiconductor substrate and a second-conduction-type region at another surface of the semiconductor substrate, and electrode formation of forming a first electrode connected to the first-conduction-type region and a second electrode connected to the second-conduction-type region. In the conductive region formation, the first-conduction-type region is formed by forming a dopant layer containing a first-conduction-type dopant over the one surface of the semiconductor substrate, and heat-treating the dopant layer, and the second-conduction-type region is formed by ion-implanting a second-conduction-type dopant into the semiconductor substrate at the another surface of the semiconductor substrate.

19 Claims, 8 Drawing Sheets

(52) U.S. Cl.
CPC ........ *H01L 31/068* (2013.01); *H01L 31/1804* (2013.01); *Y02E 10/547* (2013.01); *Y02P 70/521* (2015.11)

(58) Field of Classification Search
CPC ........... H01L 31/0288; H01L 31/02963; H01L 31/03042; H01L 31/03125; H01L 31/0321
See application file for complete search history.

(56) References Cited

U.S. PATENT DOCUMENTS

| | | |
|---|---|---|
| 2012/0199202 A1 | 8/2012 | Prajapati |
| 2013/0089942 A1 | 4/2013 | Boescke |
| 2013/0344647 A1* | 12/2013 | Cheong .................. H01L 31/18 438/98 |
| 2015/0140725 A1* | 5/2015 | Scardera ............ H01L 31/0201 438/98 |
| 2016/0118508 A1 | 4/2016 | Bock et al. |
| 2016/0284924 A1* | 9/2016 | Bronsveld ....... H01L 31/022441 |

FOREIGN PATENT DOCUMENTS

| | | |
|---|---|---|
| JP | 53-63993 A | 6/1978 |
| JP | 2013-524524 A | 6/2013 |
| JP | 2013-529856 A | 7/2013 |

\* cited by examiner

METHOD FOR MANUFACTURING SOLAR CELL INCLUDING A PATTERNED DOPANT LAYER

CROSS-REFERENCE TO RELATED APPLICATION

This application claims the priority benefit of Korean Patent Application No. 10-2015-0007896 filed on Jan. 16, 2015 in the Korean Intellectual Property Office, the disclosure of which is incorporated herein by reference.

BACKGROUND OF THE INVENTION

1. Field of the Invention

Embodiments of the invention relate to a method for manufacturing a solar cell, and more particularly to a method for manufacturing a solar cell, which achieves an improvement in the manufacturing processes thereof.

2. Description of the Related Art

Recently, as existing energy resources such as petroleum and coal are depleted, interest in alternative energy sources is increasing. In particular, a solar cell is highlighted as a next-generation cell capable of converting solar energy into electric energy.

Such a solar cell may be manufactured by forming various layers and various electrodes in accordance with desired designs. In connection with this, the efficiency of the solar cell may be determined in accordance with the designs of the various layers and electrodes. For commercial availability of such a solar cell, it is necessary to overcome problems associated with low efficiency of the solar cell. In this regard, technologies capable of maximizing efficiency of solar cells are needed. In addition, a solar cell manufacturing method capable of simply manufacturing a solar cell having excellent efficiency is needed.

SUMMARY OF THE INVENTION

Therefore, the invention has been made in view of the above problems, and it is an object of the invention to provide a method for manufacturing a solar cell, which is capable of achieving an improvement in the manufacturing processes thereof.

In accordance with an aspect of the invention, the above and other objects can be accomplished by the provision of a method for manufacturing a solar cell including conductive region formation of forming a first-conduction-type region at one surface of a semiconductor substrate and a second-conduction-type region at the other surface of the semiconductor substrate, and electrode formation of forming a first electrode connected to the first-conduction-type region and a second electrode connected to the second-conduction-type region. In the conductive region formation, the first-conduction-type region is formed by forming a dopant layer containing a first-conduction-type dopant over the one surface of the semiconductor substrate, and heat-treating the dopant layer, and the second-conduction-type region is formed by ion-implanting a second-conduction-type dopant into the semiconductor substrate at the other surface of the semiconductor substrate.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF THE EMBODIMENTS

Hereinafter, a method for manufacturing a solar cell in accordance with an embodiment of the invention will be described in detail with reference to the accompanying drawings. For clear explanation, the solar cell manufacturing method according to the embodiment of the invention will be described after an example of a solar cell capable of being manufactured through the solar cell manufacturing method according to the embodiment of the invention is described.

Figure 1:
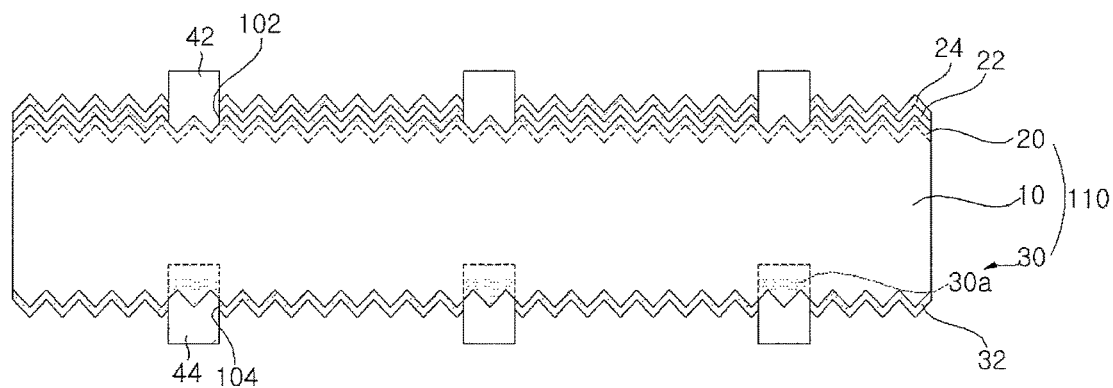
FIG. 1 is a sectional view illustrating an example of a solar cell manufactured through a solar cell manufacturing method according to an embodiment of the invention.
Figure 2:
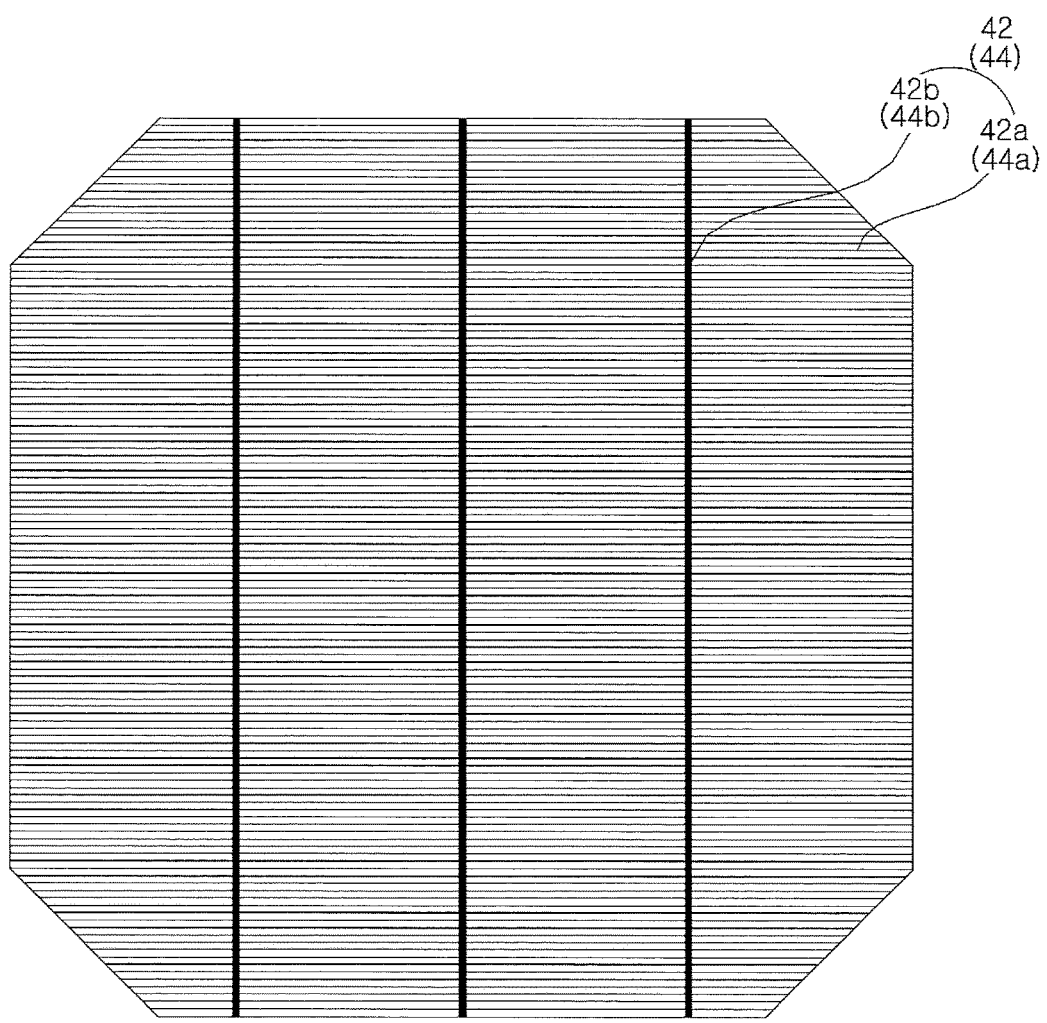
FIG. 2 is a plan view of the solar cell illustrated in FIG. 1.

FIG. 1 is a sectional view illustrating an example of a solar cell manufactured through the solar cell manufacturing method according to the embodiment of the invention. FIG. 2 is a plan view of the solar cell illustrated in FIG. 1. In FIG. 2, the solar cell is illustrated mainly in conjunction with a semiconductor substrate and electrodes thereof.

Referring to FIG. 1, the solar cell 100 according to the illustrated embodiment includes a semiconductor substrate 110 including a base region 10, conductive regions 20 and 30 formed in the semiconductor substrate 110 or on the semiconductor substrate 110, and electrodes 42 and 44 respectively connected to the conductive regions 20 and 30. In this instance, the conductive regions 20 and 30 may include a first-conduction-type region 20 having a first conductivity and a second-conduction-type region 30 having a second conductivity. The electrodes 42 and 44 may include a first electrode 42 connected to the first-conduction-type region 20 and a second electrode 44 connected to the second-conduction-type region 30. The solar cell 100 may further include a first passivation film 22, an anti-reflective film 24, a second passivation film 32, etc.

The semiconductor substrate 110 may be made of a crystalline semiconductor. For example, the semiconductor substrate 110 may be made of a single-crystalline or polycrystalline semiconductor (for example, single-crystalline or polycrystalline silicon). In particular, the semiconductor substrate 110 may be made of a single-crystalline semiconductor (for example, a single-crystalline semiconductor wafer, in more detail, a single-crystalline silicon wafer). When the semiconductor substrate 110 is made of a single-crystalline semiconductor (for example, single-crystalline silicon), the solar cell 100 exhibits reduced defects because the solar cell 100 is based on the semiconductor substrate 110, which has high crystallinity. Thus, the solar cell 100 may have excellent electrical characteristics.

The front and/or back surface of the semiconductor substrate 110 may have an uneven surface structure having protrusions and grooves through texturing. For example, the protrusions and grooves have a pyramid shape having an outer surface constituted by a (111)-oriented surface of the semiconductor substrate 110 while having an irregular size. For example, when the front surface of the semiconductor substrate 110 has increased surface roughness in accordance with formation of protrusions and grooves through texturing, it may be possible to reduce reflectance of light incident through the front surface of the semiconductor substrate 110. Accordingly, an amount of light reaching a pn junction formed by the base region 10 and first-conduction-type region 20 may be increased and, as such, shading loss may be minimized. However, the embodiment of the invention is not limited to the above-described structure. The semiconductor substrate 110 may not have, at the front and back surfaces thereof, protrusions and grooves formed through texturing.

The base region 10 of the semiconductor substrate 110 may be doped with a second-conduction-type dopant at a relatively low doping concentration and, as such, has the second conductivity. For example, the base region 10 may be arranged farther from the front surface of the semiconductor substrate 110 or closer to the back surface of the semiconductor substrate 110 than the first-conduction-type region 20. In addition, the base region 10 may be arranged closer to the front surface of the semiconductor substrate 110 or farther from the back surface of the semiconductor substrate 110 than the second-conduction-type region 30. Of course, the embodiment of the invention is not limited to such an arrangement, and the location of the base region 10 may be varied.

In this instance, the base region 10 may be made of a crystalline semiconductor containing a second-conduction-type dopant, for example, a single-crystalline or polycrystalline semiconductor (for example, single-crystalline or polycrystalline silicon) containing a second-conduction-type dopant. In particular, the base region 10 may be made of a single-crystalline semiconductor (for example, a single-crystalline semiconductor wafer, in more detail, a single-crystalline silicon wafer) containing a second-conduction-type dopant.

The second conduction type may be an n-type or a p-type. When the base region 10 has n-type conductivity, the base region 10 may be made of a single-crystalline or polycrystalline semiconductor doped with a Group-V element such as phosphorous (P), arsenic (As), bismuth (Bi) or antimony (Sb). On the other hand, when the base region 10 has p-type conductivity, the base region 10 may be made of a single-crystalline or polycrystalline semiconductor doped with a Group-III element such as boron (B), aluminum (Al), gallium (Ga), or indium (In).

Of course, the embodiment of the invention is not limited to the above-described materials, and the base region 10 and second-conduction-type dopant may be constituted by various materials.

For example, the base region 10 may have n-type conductivity. Then, the first-conduction-type region 20, which forms a pn junction together with the base region 10, has p-type conductivity. When light is irradiated to such a pn junction, electrons produced in accordance with a photoelectric effect migrate toward the back surface of the semiconductor substrate 110 and, as such, are collected by the second electrode 44. Meanwhile, holes migrate toward the front surface of the semiconductor substrate 110 and, as such, are collected by the first electrode 42. As a result, electric energy is generated. Then, holes having a lower movement rate than electrons migrate toward the back surface of the semiconductor substrate 110, rather than the front surface of the semiconductor substrate 110 and, as such, photoelectric conversion efficiency may be enhanced. Of course, the embodiment of the invention is not limited to the above-described conditions, and the base region 10 and second-conduction-type region 30 may have p-type conductivity, and the first-conduction-type region 20 may have n-type conductivity.

The first-conduction-type region 20, which has the first conductivity opposite that of the base region 10, may be formed at the front surface of the semiconductor substrate 110. The first-conduction-type region 20 forms a pn junction together with the base region 10 and, as such, constitutes an emitter region to produce carriers in accordance with the photoelectric effect.

In the illustrated embodiment, the first-conduction-type region 20 may be constituted by a doped region constituting a portion of the semiconductor substrate 110. In this instance, the first-conduction-type region 20 may be made of a crystalline semiconductor containing a first-conduction-type dopant. For example, the first-conduction-type region 20 may be made of a single-crystalline or polycrystalline semiconductor (for example, single-crystalline or polycrystalline silicon) containing a first-conduction-type dopant. In particular, the first-conduction-type region 20 may be made of a single-crystalline semiconductor (for example, a single-crystalline semiconductor wafer, in more detail, a single-crystalline silicon wafer) containing a first-conduction-type dopant. When the first-conduction-type region 20 constitutes a portion of the semiconductor substrate 110, as described above, junction characteristics of the base region 10 and first-conduction-type region 20 may be enhanced.

Of course, the embodiment of the invention is not limited to the above-described conditions and, the first-conduction-type region 20 may be formed on the semiconductor substrate 110, separately from the semiconductor substrate 110. In this instance, the first-conduction-type region 20 may be constituted by a semiconductor layer having a crystalline structure different from that of the semiconductor substrate 110, for easy formation thereof on the semiconductor substrate 110. For example, the first-conduction-type region 20 may be formed by doping an amorphous semiconductor, microcrystalline semiconductor, or polycrystalline semiconductor (for example, an amorphous silicon, microcrystalline silicon, or polycrystalline silicon), which may be easily manufactured through various methods such as deposition, with a first-conduction-type dopant. Of course, other variations are possible.

The first-conduction-type may be a p-type or an n-type. When the first-conduction-type region 20 has p-type conductivity, the first-conduction-type region 20 may be made of a single-crystalline or polycrystalline semiconductor doped with a Group-III element such as boron (B), aluminum (Al), gallium (Ga), or indium (In). On the other hand, when the first conduction type has n-type conductivity, the first-conduction-type region 20 may be made of a single-crystalline or polycrystalline semiconductor doped with a Group-V element such as phosphorous (P), arsenic (As), bismuth (Bi) or antimony (Sb). For example, the first-conduction-type region 20 may be a single-crystalline or polycrystalline semiconductor doped with boron. Of course, the embodiment of the invention is not limited to the above-described materials, and various materials may be used as the first-conduction-type dopant.

In the drawings, the first-conduction-type region 20 is illustrated as having a homogeneous structure having a uniform doping concentration throughout the first-conduction-type region 20. Of course, the embodiment of the invention is not limited to the above-described structure. In another embodiment, the first-conduction-type region 20 may have a selective structure. In the selective structure, the first-conduction-type region 20 may have a high doping concentration, a great junction depth, and low resistance at a portion thereof adjacent to the first electrode 42 while having a low doping concentration, a small junction depth, and high resistance at the remaining portion of the first-conduction-type region 20. The first-conduction-type region 20 may have various structures and various shapes other than the above-described structures and shapes.

The second-conduction-type region 30, which has the second conductivity identical to that of the base region 10 while being doped with a second-conduction-type dopant in a higher doping concentration than the base region 10, may be formed at the back surface side of the semiconductor substrate 110. The second-conduction-type region 30 forms a back surface field region, which generates a back surface field, to prevent loss of carriers caused by re-coupling or recombination thereof at a surface of the semiconductor substrate 110 (in more detail, the back surface of the semiconductor substrate 110.

In the illustrated embodiment, the second-conduction-type region 30 may be constituted by a doped region constituting a portion of the semiconductor substrate 110. In this instance, the second-conduction-type region 30 may be made of a crystalline semiconductor containing a second-conduction-type dopant. For example, the second-conduction-type region 30 may be made of a single-crystalline or polycrystalline semiconductor (for example, single-crystalline or polycrystalline silicon) containing a second-conduction-type dopant. In particular, the second-conduction-type region 30 may be made of a single-crystalline semiconductor (for example, a single-crystalline semiconductor wafer, in more detail, a single-crystalline silicon wafer) containing a second-conduction-type dopant. When the second-conduction-type region 30 constitutes a portion of the semiconductor substrate 110, as described above, junction characteristics of the base region 10 and second-conduction-type region 30 may be enhanced.

Of course, the embodiment of the invention is not limited to the above-described conditions and, the second-conduction-type region 30 may be formed on the semiconductor substrate 110, separately from the semiconductor substrate 110. In this instance, the second-conduction-type region 30 may be constituted by a semiconductor layer having a crystalline structure different from that of the semiconductor substrate 110, for easy formation thereof on the semiconductor substrate 110. For example, the second-conduction-type region 30 may be formed by doping an amorphous semiconductor, microcrystalline semiconductor, or polycrystalline semiconductor (for example, an amorphous silicon, microcrystalline silicon, or polycrystalline silicon), which may be easily manufactured through various methods such as deposition, with a second-conduction-type dopant. Of course, other variations are possible.

The second-conduction-type may be an n-type or a p-type. When the second-conduction-type region 30 has n-type conductivity, the second-conduction-type region 30 may be made of a single-crystalline or polycrystalline semiconductor doped with a Group-V element such as phosphorous (P), arsenic (As), bismuth (Bi) or antimony (Sb). On the other hand, the second conduction type has p-type conductivity, the second-conduction-type region 30 may be made of a single-crystalline or polycrystalline semiconductor doped with a Group-III element such as boron (B), aluminum (Al), gallium (Ga), or indium (In). For example, the second-conduction-type region 30 may be a single-crystalline or polycrystalline semiconductor doped with phosphorous. Of course, the embodiment of the invention is not limited to the above-described materials, and various materials may be used as the second-conduction-type dopant. In addition, the second-conduction-type dopant of the second-conduction-type region 30 may be identical to the second-conduction-type dopant of the base region 10 or may differ from the second-conduction-type dopant of the base region 10.

In this embodiment, the second-conduction-type region 30 may have a local structure. That is, the second-conduction-type region 30 may include a first portion 30a locally formed at a portion of the second-conduction-type region 30 connected to the second electrode 44. For example, the first portion 30a may be locally formed to correspond to an area where finger electrodes 44a are formed or an area where bus bar electrodes 44b are formed, without being formed at the remaining area. In this instance, accordingly, the second-conduction-type region 30 exhibits reduced contact resistance to the second electrode 44 at the portion thereof connected to the second electrode 44 and, as such, may have excellent fill factor (FF) characteristics. On the other hand, no second-conduction-type region 30 constituted by a doped region is formed at an area not connected to the second electrode 44 and, as such, possibility of re-coupling or recombination of carriers at the doped region may be reduced. Accordingly, short-circuit current density Jsc and open-circuit voltage may be enhanced. In addition, excellent internal quantum efficiency (IQE) may be exhibited at the area where no second-conduction-type region is formed and, as such, characteristics associated with long-wavelength light may be excellent. Accordingly, it may be possible to greatly enhance characteristics associated with long-wavelength light, as compared to the homogenous structure and selective structure having a doped region throughout the structure. Thus, the second-conduction-type region 30, which has the local structure as described above, may have excellent fill factor, short-circuit current density, and open-circuit voltage and, as such, may achieve an enhancement in efficiency of the solar cell 100.

Figure 3:
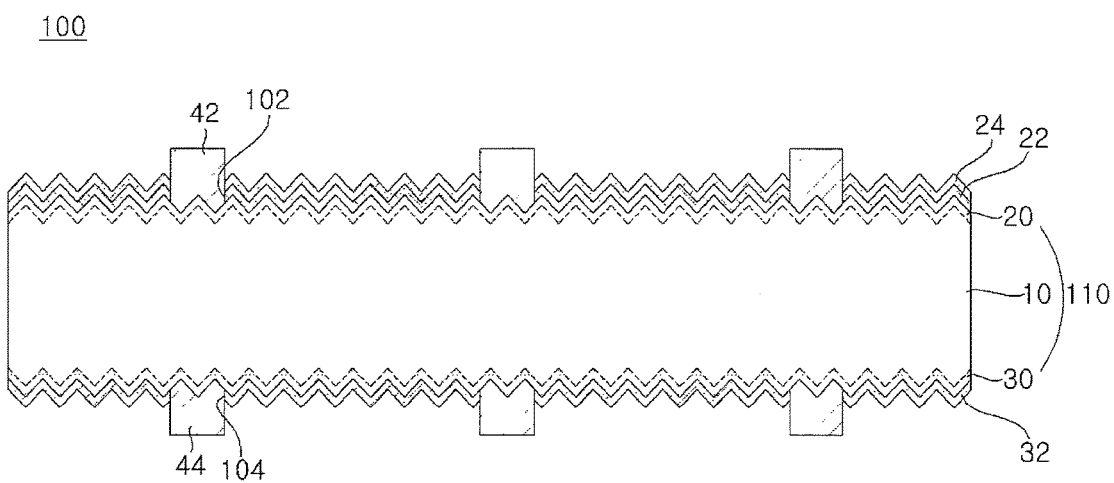
FIG. 3 is a sectional view illustrating another example of a solar cell manufactured through a solar cell manufacturing method according to an embodiment of the invention.

Of course, the embodiment of the invention is not limited to the above-described structures. As illustrated in FIG. 3, the second-conduction-type region 30 may have a homogeneous structure having a uniform doping concentration throughout the second-conduction-type region 30. In another embodiment, the second-conduction-type region 30 may have a selective structure. In the selective structure, the second-conduction-type region 30 may have a high doping concentration, a great junction depth, and low resistance at a portion thereof adjacent to the second electrode 44 while having a low doping concentration, a small junction depth, and high resistance at the remaining portion of the second-conduction-type region 30. The second-conduction-type region 30 may have various structures and shapes other than the above-described structures and shapes.

The first passivation film 22 and anti-reflective film 24 are sequentially formed over the front surface of the semiconductor substrate 110, in more detail, on the first-conduction-type region 20 formed in or on the semiconductor substrate 110. The first electrode 42 is electrically connected to (in more detail, contacts) the first-conduction-type region 20 through the first passivation film 22 and anti-reflective film 24 (namely, through openings 102).

The first passivation film 22 and anti-reflective film 24 may be substantially formed at an entire portion the front surface of the semiconductor substrate 110, except for the openings 102 corresponding to the first electrode 42.

The first passivation film 22 is formed to contact the first-conduction-type region 20 and, as such, inactivates defects present in the surface or bulk of the first-conduction-type region 20. Thus, recombination sites of minority carriers are removed and, as such, open-circuit voltage Voc of the solar cell 100 may be increased. The anti-reflective film 24 reduces reflectance of light incident upon the front surface of the semiconductor substrate 110. Thus, the amount of light reaching a pn junction formed by the base region 10 and the first-conduction-type region 20 may be increased in accordance with reduced reflectance of light incident upon the front surface of the semiconductor substrate 110. Accordingly, short-circuit current Isc of the solar cell 100 may be increased. As a result, the open-circuit voltage and short-circuit current Isc of the solar cell 100 may be increased by the first passivation film 22 and anti-reflective film 24 and, as such, the efficiency of the solar cell 100 may be enhanced.

The first passivation film 22 may be made of various materials. For example, the first passivation film 22 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, when the first-conduction-type region 20 has n-type conductivity, the first passivation film 22 may include a silicon oxide film or silicon nitride film having fixed positive charges. On the other hand, when the first-conduction-type region 20 has p-type conductivity, the first passivation film 22 may include an aluminum oxide film having fixed negative charges.

The anti-reflective film 24 may be made of various materials. For example, the anti-reflective film 24 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, the anti-reflective film 24 may include a silicon nitride film.

Of course, the embodiment of the invention is not limited to the above-described materials, and the first passivation film 22 and anti-reflective film 24 may be made of various materials. One of the first passivation film 22 and anti-reflective film 24 may perform both the anti-reflection function and the passivation function and, as such, the other of the first passivation film 22 and anti-reflective film 24 may be omitted. Various films other than the first passivation film 22 and anti-reflective film 24 may also be formed on the semiconductor substrate 110. In addition, various variations are possible.

The first electrode 42 is electrically connected to the first-conduction-type region 20 via the openings 102 formed through the first passivation film 22 and anti-reflective film 24 (that is, through the first passivation film 22 and anti-reflective film 24). The first electrode 42 may be made of a material having excellent electrical conductivity (for example, metals). The first electrode 42 may have a certain pattern to allow transmission of light. The structure of the first electrode 42 will be again described later with reference to FIG. 2.

The second passivation film 32 is formed on the back surface of the semiconductor substrate 110, in more detail, on the second-conduction-type region 30 formed at the semiconductor substrate 110. The second electrode 44 is electrically connected to (for example, contacts) the second-conduction-type region 30 through the second passivation film 32 (namely, through openings 104).

The second passivation film 32 may be substantially formed throughout the back surface of the semiconductor substrate 110, except for the openings 104 corresponding to the second electrode 44.

The second passivation film 32 is formed to contact the second-conduction-type region 30 and, as such, inactivates defects present in the surface or bulk of the second-conduction-type region 30. Thus, recombination sites of minority carriers are removed and, as such, open-circuit voltage Voc of the solar cell 100 may be increased.

The second passivation film 32 may be made of various materials. For example, the second passivation film 32 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, when the second-conduction-type region 30 has n-type conductivity, the second passivation film 32 may include a silicon oxide film or silicon nitride film having fixed positive charges. On the other hand, when the second-conduction-type region 30 has p-type conductivity, the second passivation film 32 may include an aluminum oxide film having fixed negative charges.

Of course, the embodiment of the invention is not limited to the above-described materials, and the second passivation film 32 may be made of various materials. Various films other than the second passivation film 32 may also be formed on the back surface of the semiconductor substrate 110. In addition, various variations are possible.

The second electrode 44 is electrically connected to the second-conduction-type region 30 via the openings 104 formed through the second passivation film 32. The second electrode 44 may be made of various materials (for example, metals), and may have various structures.

Hereinafter, planar structures of the first and second electrodes 42 and 44 will be described in detail with reference to FIG. 2.

Referring to FIG. 2, each of the first and second electrodes 42 and 44 may include a plurality of finger electrodes 42a or 44a spaced apart from one another while having a uniform pitch. In FIG. 2, the finger electrodes 42a or 44a are illustrated as being arranged in parallel while being parallel to one edge of the semiconductor substrate 110. Of course, the embodiment of the invention is not limited to the above-described arrangement. In addition, each of the first and second electrodes 42 and 44 may include bus bar electrodes 42b or 44b formed in a direction crossing the finger electrodes 42a or 44a, to connect the finger electrodes 42a or 44a. In an embodiment, one bus bar electrode 42b and one bus bar electrode 44b may be provided. Alternatively, as illustrated in FIG. 2, a plurality of bus bar electrodes 42b and a plurality of bus bar electrodes 44b may be provided. In this instance, the bus bar electrodes 42b or 44b may have a greater pitch than the finger electrodes 42a or 44a. Of course, the embodiment of the invention is not limited to the above-described condition. For example, the bus bar electrodes 42b or 44b may have a width equal to or smaller than the finger electrodes 42a or 44a.

When viewed through a cross-sectional view, all of the finger electrodes 42a and bus bar electrodes 42b of the first electrode 42 may be formed to extend through the first passivation film 22 and anti-reflective film 24. That is, the openings 102 may be formed to correspond to the finger electrodes 42a and bus bar electrodes 42b. In addition, all of the finger electrodes 44a and bus bar electrodes 44b of the second electrode 44 may be formed to extend through the second passivation film 32. That is, the openings 104 may be formed to correspond to the finger electrodes 44a and bus bar electrodes 44b. Of course, the embodiment of the invention is not limited to the above-described structures. In another embodiment, the finger electrodes 42a of the first electrode 42 may be formed to extend through the first passivation film 22 and anti-reflective film 24, and the bus bar electrodes 42b of the first electrode 42 may be formed on the first passivation film 22 and anti-reflective film 24. In this instance, the openings 102 may be formed to have a structure corresponding to that of the finger electrodes 42a, without being formed in areas where only the bus bar electrodes 42b are disposed. In addition, the finger electrodes 44a of the second electrode 44 may be formed to extend through the second passivation film 32, and the bus bar electrodes 44b of the second electrode 44 may be formed on the second passivation film 32. In this instance, the openings 104 may be formed to have a structure corresponding to that of the finger electrodes 44a, without being formed in areas where only the bus bar electrodes 44b are disposed.

For brief illustration, in FIG. 2, the first and second electrodes 42 and 44 are illustrated as having the same planar structure. Of course, the embodiment of the invention is not limited to the above-described condition. The widths, pitches, etc., of the finger electrodes 42a and bus bar electrodes 42b in the first electrode 42 may differ from those of the finger electrodes 44a and bus bar electrodes 44b in the second electrode 44. In particular, in order to make the first electrode 42, upon which an increased amount of light is incident, have a greater area than the second electrode 44, the finger electrodes 42a and/or bus bar electrodes 42b of the first electrode 42 may have a smaller width than the finger electrodes 44a and/or bus bar electrodes 44b of the second electrode 44 or a greater pitch than the finger electrodes 44a and/or bus bar electrodes 44b of the second electrode 44. Alternatively, the first and second electrodes 42 and 44 may have different planar structures. Other variations are possible.

As described above, in this embodiment, the first and second electrodes 42 and 44 of the solar cell 100 have predetermined patterns and, as such, the solar cell 100 has a bi-facial structure in which light can be incident upon both the front and back surfaces of the semiconductor substrate 110. Accordingly, the amount of light utilized by the solar cell 100 is increased and, as such, an enhancement in efficiency of the solar cell 100 may be achieved.

Of course, the embodiment of the invention is not limited to the above-described structure. The second electrode 44 may have a structure formed throughout the back surface of the semiconductor substrate 110. The first and second-conduction-type regions 20 and 30 and the first and second electrodes 42 and 44 may also be arranged at one surface of the semiconductor substrate 110 (for example, the back surface). In addition, at least one of the first and second-conduction-type regions 20 and 30 may be formed to extend over both surfaces of the semiconductor substrate 110. That is, the above-described solar cell 100 is only an example, to which the solar cell manufacturing method according to the embodiment of the invention is applicable, and, as such, the embodiment of the invention is not limited thereto.

Hereinafter, the method for manufacturing the solar cell 100 in accordance with the embodiment of the invention will be described in detail with reference to FIG. 4 and FIGS. 5A to 5I.

Figure 4:
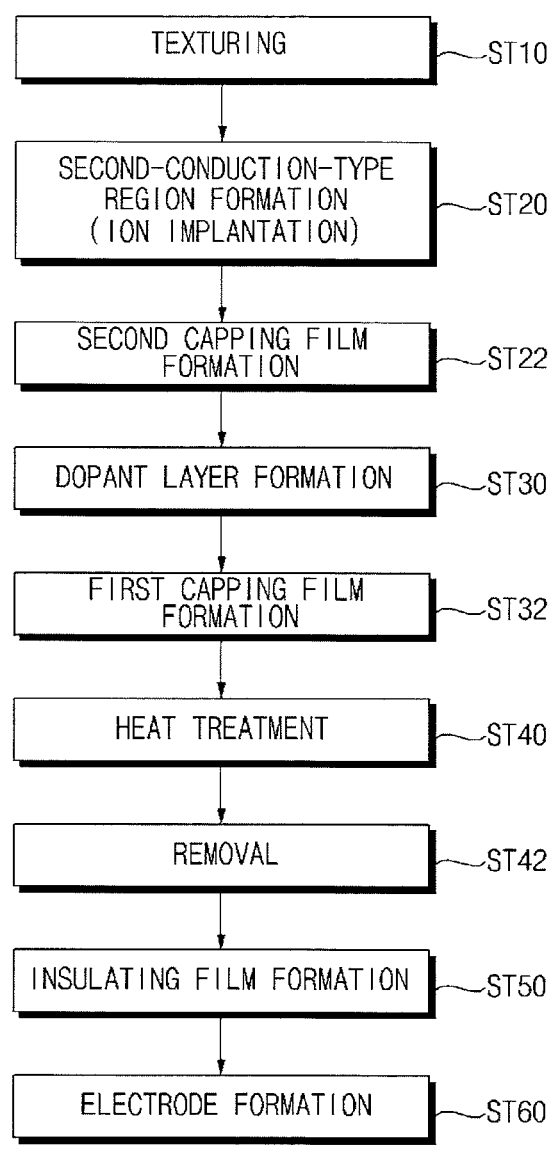
FIG. 4 is a flowchart illustrating the solar cell manufacturing method according to the embodiment of the invention.

FIG. 4 is a flowchart illustrating the solar cell manufacturing method according to the embodiment of the invention. FIGS. 5A to 5I are sectional views illustrating the solar cell manufacturing method according to the embodiment of the invention. No detailed description will be given of the matters explained previously through the description given of the solar cell 100 with reference to FIGS. 1 and 2, and a detailed description will be given of matters not explained previously.

Referring to FIG. 4, the method for manufacturing the solar cell 100 in accordance with the illustrated embodiment includes texturing ST10, second-conduction-type region formation ST20 using ion implantation, dopant layer formation ST30, heat treatment ST40, removal ST42, insulating film formation ST50, and electrode formation ST60. The solar cell manufacturing method may further include second capping film formation ST22 and first capping film formation ST32. Hereinafter, this will be described in more detail.

Figure 5A:
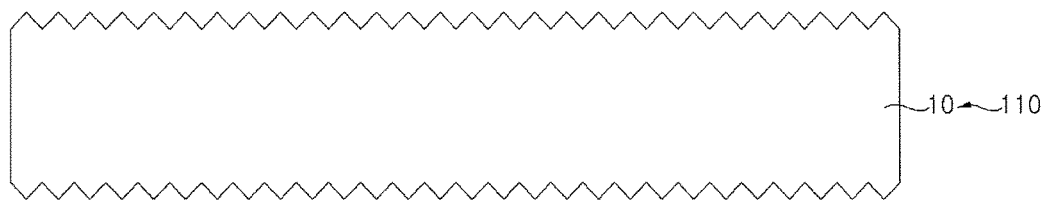
FIGS. 5A to 5I are sectional views illustrating the solar cell manufacturing method according to the embodiment of the invention.

First, as illustrated in FIGS. 4 and 5A, in texturing ST10, the semiconductor substrate 110, which includes the base region 10 having a second-conduction-type dopant, may be subjected to texturing at at least one of the front and back surfaces thereof.

For example, in this embodiment, the semiconductor substrate 110 may be constituted by a silicon substrate (for example, a silicon wafer) having an n-type dopant (in particular, phosphorous (P)). Of course, the embodiment of the invention is not limited to the above-described condition. The base region 10 may have a p-type dopant other than boron or other n-type dopants.

Surface texturing of the semiconductor substrate 110 may be achieved using wet or dry texturing. Wet texturing may be achieved by dipping the semiconductor substrate 110 in a texturing solution. This wet texturing has an advantage of a short process time. Dry texturing is achieved by milling the surface of the semiconductor substrate 110 using a diamond drill or laser. Although dry texturing may form a uniform structure of protrusions and grooves, there may be drawbacks in that a long process time is required, and the semiconductor substrate 110 may be damaged. Alternatively, surface texturing of the semiconductor substrate 110 may be achieved using reactive ion etching (RIE). Thus, in the embodiment of the invention, the semiconductor substrate 110 may be textured using various methods.

In the drawings, both the front and back surfaces of the semiconductor substrate 110 are illustrated as being subjected to texturing, in order to minimize reflection of light incident upon the front and back surfaces. Of course, the embodiment of the invention is not limited to the above-described condition. Other variations may also be possible.

Thereafter, as illustrated in FIG. 5B to 5G, the conductive regions 20 and 30 are formed in or on the semiconductor substrate 110. In more detail, in this embodiment, formation of the first-conduction-type region 20 may be achieved by forming a dopant layer 206 having a first-conduction-type dopant over one surface of the semiconductor substrate 100, and then heat-treating the dopant layer 206. Formation of the second-conduction-type region 30 may be achieved by ion-implanting a second-conduction-type dopant into the other surface of the semiconductor substrate 100.

Thus, it may be possible to dope the first-conduction-type dopant only in one surface of the semiconductor substrate 110 by forming the dopant layer 206 only over one surface of the semiconductor substrate 110, and heat-treating the dopant layer 206. On the other hand, it may be possible to easily dope the second-conduction-type dopant in the other surface of the semiconductor substrate 110 by carrying out, on the other surface of the semiconductor substrate 110, ion implantation capable of easily achieving cross-sectional doping. Thus, it may be possible to easily dope dopants of different conduction type at both surfaces of the semiconductor substrate 110, respectively. The first-conduction-type dopant may be doped in one surface of the semiconductor substrate 110, to have a desired implantation depth, a desired doping concentration and the like by adjusting the thickness, doping concentration and heat treatment temperature of the dopant layer 206 formed for formation of the first-conduction-type region 20. The second-conduction-type dopant may be doped in the other surface of the semiconductor substrate 110, to have a desired implantation depth, a desired doping concentration and the like by adjusting the ion implantation energy, implantation rate and the like used for formation of the second-conduction-type region 30.

In this embodiment, for example, the first-conduction-type region 20, which is disposed at the front surface of the semiconductor substrate 110 while having p-type conductivity, is formed using the dopant layer 206 having the first-conduction-type dopant, and the second-conduction-type region 30, which is disposed at the back surface of the semiconductor substrate 110 while including the second-conduction-type dopant, is formed through ion implantation and heat treatment for activation of implanted ions. Thus, the first-conduction-type region 20 may be easily formed over the front surface of the semiconductor substrate 110 through heat treatment of the dopant layer 206. In addition, it may be possible to form the second-conduction-type region 30, which is disposed at the back surface of the semiconductor substrate 110, to constitute a back surface field region, such that the second-conduction-type region 30 has a desired shape. That is, when the second-conduction-type region 30 has the first portion 30*a* having a local structure, as illustrated in FIG. 1, it may be possible to easily form the second-conduction-type region 30 having a desired shape through ion implantation using a mask or the like.

In particular, when the first-conduction-type dopant of the first-conduction-type region 20 has p-type conductivity, and the second-conduction-type dopant of the base region 10 and second-conduction-type region 30 has n-type conductivity, it may be possible to simplify processes applied thereto. On the other hand, when the first-conduction-type dopant has n-type conductivity, and the second-conduction-type dopant has p-type conductivity, the second-conduction-type region 30 having the second-conduction-type dopant may be formed through diffusion of a material (for example, aluminum) included in the second electrode 44. In this instance, accordingly, it is unnecessary to separately form the second-conduction-type region 30. On the other hand, when the second-conduction-type region 30 has n-type conductivity, as in this embodiment, it is necessary to perform a process for forming the second-conduction-type region 30. In connection therewith, the second-conduction-type region 30 is formed through ion implantation and, as such, the formation process may be further simplified.

Figure 5B:
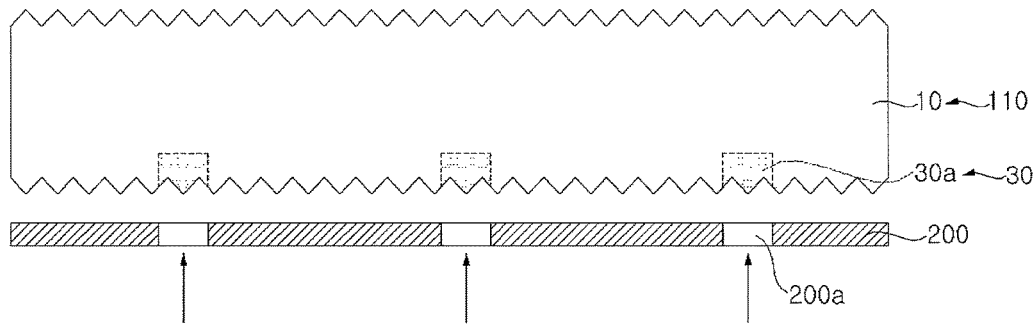

Hereinafter, processes for forming the first and second-conduction-type regions 20 and 30 will be described in more detail. First, as illustrated in FIGS. 4 and 5B, in second-conduction-type region formation ST20, a second-conduction-type dopant is implanted into the back surface of the semiconductor substrate 110 through ion implantation and, as such, the second-conduction-type region 30 may be formed. Since cross-sectional doping is possible through ion implantation, it may be possible to ion-implant the second-conduction-type dopant only into the back surface of the semiconductor substrate 110 without ion-implanting the second-conduction-type dopant into the front surface of the semiconductor substrate 110.

As illustrated in FIG. 5B, the second-conduction-type region 30, which has a local structure, may be formed through ion implantation of the second-conduction-type dopant under the condition that a mask 200 having openings 200*a* corresponding to the first portion 30*a* is disposed. When the second-conduction-type dopant is ion-implanted under the condition that the mask 200 is not provided, the second-conduction-type region 30, which has a homogeneous structure, may be formed, as illustrated in FIG. 3.

For example, ion implantation may include ion implantation using ribbon beams, ion implantation using plasma assisted doping (PLAD) or the like. Of course, the embodiment of the invention is not limited to the above-described condition. Other ion implantation methods may be used.

Although the second-conduction-type region 30 is illustrated in the drawings as being formed by a doped region constituting a part of the semiconductor substrate 110, the embodiment of the invention is not limited thereto. That is, the second-conduction-type region 30 may be constituted by a semiconductor layer formed over the back surface of the semiconductor substrate 110 while being doped with the second-conduction-type dopant. In this instance, formation of the second-conduction-type region 30 may be achieved by forming a semiconductor layer over the back surface of the semiconductor substrate 110, and then ion-implanting the second-conduction-type dopant into the semiconductor layer through ion implantation. Other variations may be possible.

Figure 5C:
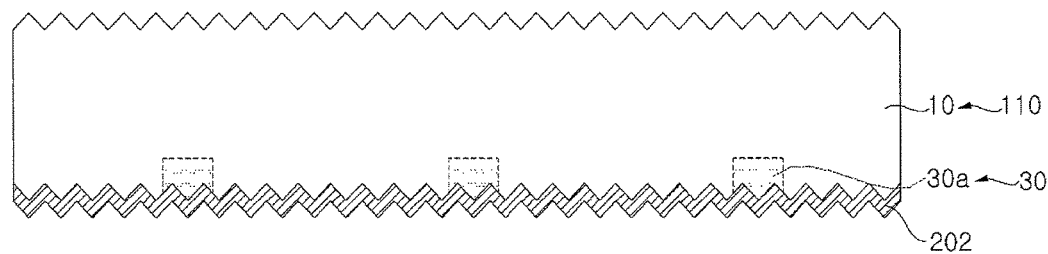

Subsequently, as illustrated in FIGS. 4 and 5C, in second capping film formation ST22, a second capping film 202 may be formed over the second-conduction-type region 30. The second capping film 202 may function as an external anti-diffusion film to prevent the second-conduction-type dopant from being externally diffused during activation heat treatment of the second-conduction-type region 30. In this embodiment, the first-conduction-type region 20 is formed after formation of the second capping film 202, the second capping film 202 may function to prevent the first-conduction-type dopant from being doped into the second-conduction-type region 30 during formation of the first-conduction-type region 20. Accordingly, it may be possible to prevent degradation of characteristics of the second-conduction-type region 30 due to the first-conduction-type dopant.

The second capping film 202 may include various materials, and may be formed using various methods.

For example, the second capping film 202 may include an oxide. In more detail, the second capping film 202 may include silicon oxide. The second capping film 202 including oxide (in particular, silicon oxide) exhibits excellent barrier effects capable of preventing introduction or discharge of the associated dopant, and may be easily and inexpensively formed using a simple method.

The second capping film 202 may be formed using deposition. In this instance, it may be possible to form the second capping film 202 using the same deposition equipment as that of the dopant layer 206 formed to form the first-conduction-type region 20 after formation of the second capping film 202. That is, process simplification may be achieved through formation of the second capping film 202 and dopant layer 206 using an in-situ process. This will be described later in more detail. The second capping film 202 may be formed at a temperature of 400 to 500 C.°, using raw gas containing oxygen gas as an oxygen source, silicon-containing gas (for example, silane gas) as a silicon source, and nitrogen gas as a carrier gas. Alternatively, the second capping film 202 may be formed using atmospheric pressure chemical vapor deposition (APCVD) using no plasma. In this instance, accordingly, it may be possible to form the second capping film 202 without possibility of plasma damage occurring when plasma is used and, as such, characteristics of the second-conduction-type region 30 may be improved.

The second capping film 202 may have a thickness capable of preventing the second-conduction-type dopant in the second-conduction-type region 30 from being externally discharged while preventing external impurities, the first-conduction-type dopant, etc., from being introduced into the second-conduction-type region 30. For example, the second capping film 202 may have a thickness of 20 nm or more. When the thickness of the second capping film 202 is less than 20 nm, effects of the second capping film 202 may be insufficient. Although there is no upper limit as to the thickness of the second capping film 202, process time may be excessively lengthened when the thickness of the second capping film 202 is excessively great. Accordingly, the thickness of the second capping film 202 may be equal to or less than, for example, 100 μm (for example, 10 μm).

Of course, the embodiment of the invention is not limited to the above-described conditions. The material, formation process, thickness, etc., of the second capping film 202 may be varied.

Figure 5D:
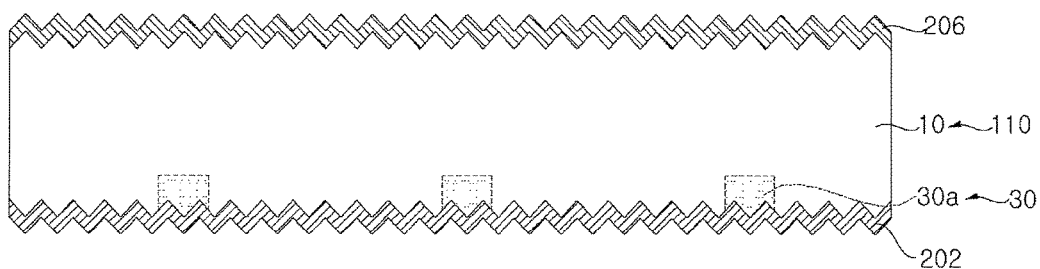

Thereafter, as illustrated in FIGS. 4 and 5D, in dopant layer formation ST30, the dopant layer 206, which includes a first-conduction-type dopant, is formed over the front surface of the semiconductor substrate 110. The dopant layer 206 may be formed throughout the front surface of the semiconductor substrate 110. In this instance, accordingly, formation of the dopant layer 206 may be achieved using s simple process. As the dopant layer 206 is subjected to heat treatment, it may be possible to form the first-conduction-type region 20 over the entire portion of the front surface of the semiconductor substrate 110.

The dopant layer 206 may be a layer made of various materials containing a first-conduction-type dopant. For example, the dopant layer 206 may be made of glass silicate containing a first-conduction-type dopant. For example, when the first-conduction-type region 20 has p-type conductivity, the dopant layer 206 may be made of glass silicate containing a Group-III element (for example, boron) exhibiting p-type conductivity. For example, the dopant layer 206 may be made of boron glass silicate (BSG). When the dopant layer 206 is made of glass silicate containing a first-conduction-type dopant, as described above, it may be possible to minimize amounts of materials, other than the first-conduction-type dopant, diffused into the semiconductor substrate 110 during heat treatment. In addition, the dopant layer 206 may be easily formed using glass silicate containing a first-conduction-type dopant through deposition.

In this embodiment, the first dopant layer 206 is illustrated as including a p-type dopant as the semiconductor substrate 110 has n-type conductivity, and the first-conduction-type region 20 has p-type conductivity. However, the embodiment of the invention is not limited to the above-described conditions. When the semiconductor substrate 110 has p-type conductivity, and the first-conduction-type region 20 has n-type conductivity, and, as such, the dopant layer 206 has n-type conductivity, the dopant layer 206 may be made of glass silicate containing an n-type dopant (for example, phosphorous) (for example, phosphorous glass silicate (PSG). Of course, the embodiment of the invention is not limited to the above-described material, and the first dopant layer 206 may be made of various materials other than the above-described material.

The dopant layer 206 may be formed through deposition. The dopant layer 206 may be formed at a temperature of 400 to 500 C.°, using raw gas including oxygen gas as an oxygen source, silicon-containing gas (for example, silane gas) as a silicon source, nitrogen gas as a carrier gas, and dopant-containing gas (for example, boron-containing gas, for example, diborane ($B_2H_6$)) as a first-conduction-type dopant source. For example, the ratio of the supply amount (sccm) of silane gas to the supply amount (sccm) of diborane gas may be 1:0.06 to 1:0.2. Within this ratio range, it may be possible to form the dopant layer 206 containing the first-conduction-type dopant in a concentration capable of achieving a desired doping concentration of the first-conduction-type region 20. Of course, the embodiment of the invention is not limited to the above-described conditions, and the supply amount of the raw gas, the ratios of the supply amounts of gas components in the raw gas, etc., may be varied.

In this instance, the dopant layer 206 may be formed through atmospheric pressure chemical vapor deposition (APCVD) using no plasma. In this instance, accordingly, it may be possible to form the dopant layer 206 without possibility of plasma damage when plasma is used and, as such, characteristics of the first and second-conduction-type regions 20 and 30 may be improved.

Thus, the dopant layer 206 may be formed through deposition (in particular, APCVD), as in the second capping film 202, and the process temperature thereof may be equal or similar to that of the second capping film 202 (for example, a difference of 100° C. or less). Of course, there are differences in terms of the raw gas for formation of the second capping film 202, the raw gas for formation of the dopant layer 206, and partial pressures of the gas components in each raw gas. In more detail, for formation of the second capping film 202, oxygen gas, silicon-containing gas, and carrier gas are used, whereas oxygen gas, silicon-containing gas, carrier gas, and dopant-containing gas are used for formation of the dopant layer 206. Accordingly, the second capping film 202 and dopant layer 206 may be formed through an in-situ process in which desired procedures are successively carried out without requiring the semiconductor substrate 110 to be externally unloaded.

The internal temperature of deposition equipment is adjusted through application of heat to the semiconductor substrate 110 and cooling of the semiconductor substrate 110 for a lengthened period of time and, as such, long time is taken. On the other hand, the kind and pressure of each raw gas may be adjusted in accordance with the kinds and amounts of gas components supplied to the deposition equipment. In this regard, gas atmosphere and pressure may be easily controlled, as compared to gas temperature.

Thus, the dopant layer 206 may be formed through change of a gas supplied after formation of the second capping film 202 and adjustment of the amount of the supplied gas. For example, the dopant layer 206 may be formed by injecting gas for formation of the dopant layer 206 (for example, gas containing a semiconductor material, etc.) after removing gas used for formation of the second capping film 202 (for example, oxygen gas, nitrogen gas, chlorine gas, etc.) after formation of the second capping film 202.

The dopant layer 206 may have a thickness capable of enhancing characteristics of the first-conduction-type region 20.

For example, the dopant layer 206 may have a thickness of 50 to 120 nm. When the thickness of the dopant layer 206 is less than 50 nm, the amount of the first-conduction-type dopant in the dopant layer 206 may be insufficient and, as such, the first-conduction-type region 20 may be insufficiently formed, or surface resistance uniformity of the first-conduction-type region 20 may be reduced. On the other hand, when the thickness of the dopant layer 206 is greater than 120 nm, the first-conduction-type region 20 formed over the semiconductor substrate 110 may become a dopant rich layer (for example, a boron rich layer (BRL)). In this instance, it may be difficult to form a shallow emitter due to high concentration of the first-conduction-type dopant and, as such, efficiency of the solar cell 100 may be degraded due to reduced current density. Of course, the embodiment of the invention is not limited to the above-described conditions and, the material, formation process, thickness, etc., of the dopant layer 206 may be varied.

Alternatively, the thickness of the dopant layer 206 may be greater than the thickness of the second capping film 202. In this instance, the dopant layer 206 should have a thickness capable of achieving sufficient doping, whereas the thickness of the second capping film 202 may be reduced to the minimum. Accordingly, it may be possible to reduce formation process time and costs by relatively reducing the thickness of the second capping film 202. Of course, the embodiment of the invention is not limited to the above-described conditions, and the second capping film 202 may have a thickness equal to or greater than the dopant layer 206.

Figure 5E:
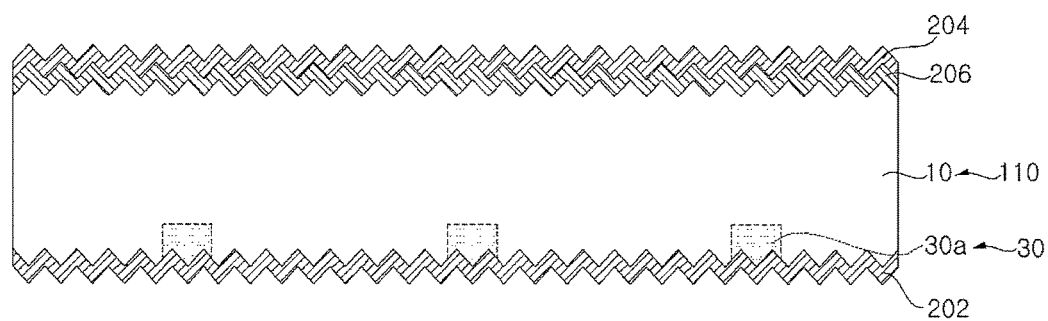

Subsequently, as illustrated in FIGS. 4 and 5E, in first capping film formation ST32, the first capping film 204 may be formed over the first-conduction-type region 20. The first capping film 204 may function as an external anti-diffusion film to prevent the first-conduction-type dopant from being externally diffused during heat treatment for formation of the first-conduction-type region 20.

The first capping film 204 may include various materials, and may be formed using various methods.

For example, the first capping film 204 may include an oxide. In more detail, the first capping film 204 may include silicon oxide. The first capping film 204 including oxide (in particular, silicon oxide) exhibits excellent barrier effects capable of preventing introduction or discharge of the associated dopant, and may be easily and inexpensively formed using a simple method.

The first capping film 204 may be formed using deposition. In this instance, it may be possible to form the first capping film 204 using the same deposition equipment as that of the dopant layer 206 formed to form the first-conduction-type region 20 after formation of the first capping film 204. That is, process simplification may be achieved through formation of the second capping film 202, dopant layer 206 and first capping film 204 using an in-situ process. The first capping film 204 may be formed at a temperature of 400 to 500 C.° (a temperature having a difference of 100° C. or less from the temperature for formation of the second capping film 202 or the temperature for formation of the dopant layer 206), using raw gas containing oxygen gas as an oxygen source, silicon-containing gas (for example, silane gas) as a silicon source, and nitrogen gas as a carrier gas. That is, the first capping film 204 may be formed in a successive manner after formation of the dopant layer 206 through change of a raw gas. In this instance, the first capping film 204 may be formed using APCVD using no plasma. In this instance, accordingly, it may be possible to form the first capping film 204 without possibility of plasma damage when plasma is used and, as such, characteristics of the first and second-conduction-type regions 20 and 30 may be improved.

The first capping film 204 may have a thickness capable of preventing the first-conduction-type dopant in the first-conduction-type region 20 from being externally discharged while preventing external impurities, etc., from being introduced into the first-conduction-type region 20. For example, the first capping film 204 may have a thickness of 20 nm or more. When the thickness of the first capping film 204 is less than 20 nm, effects of the first capping film 204 may be insufficient. Although there is no upper limit as to the thickness of the first capping film 204, process time may be excessively lengthened when the thickness of the first capping film 204 is excessively great. For example, the thickness of the first capping film 204 may be equal to or less than 100 μm (for example, 10 μm).

Of course, the embodiment of the invention is not limited to the above-described conditions. The material, formation process, thickness, etc., of the first capping film 204 may be varied.

Figure 5F:
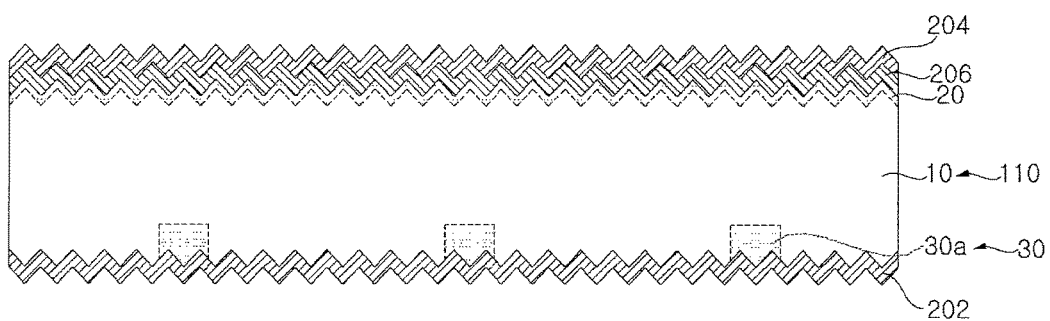

Thereafter, as illustrated in FIGS. 4 and 5F, in heat treatment ST40, the first-conduction-type dopant of the dopant layer 206 is diffused through heat treatment, thereby forming the first-conduction-type region 20. At the same time, the second-conduction-type dopant in the second-conduction-type region 30 is activated.

As the first-conduction-type dopant of the dopant layer 206 is diffused toward the front surface of the semiconductor substrate 110 in accordance with heat treatment, the first-conduction-type region 20 is formed. In this instance, the first capping film 204 prevents the first-conduction-type dopant from being externally diffused and, as such, the first-conduction-type dopant is effectively diffused into the semiconductor substrate 110.

The second-conduction-type dopant of the second-conduction-type region 30 implanted into the semiconductor substrate 110 at the back surface of the semiconductor substrate 110 through ion implantation may be present at a position other than a lattice position immediately after ion implantation thereof. In this instance, it may be difficult for the second-conduction-type dopant to effectively perform a dopant function. To this end, activation heat treatment is carried out to move the second-conduction-type dopant to the lattice position and, as such, the second-conduction-type dopant effectively performs a dopant function. In addition, the second-conduction-type dopant positioned toward the surface of the semiconductor substrate 110 is diffused into the semiconductor substrate 110 and, as such, the second-conduction-type region 30 may have a sufficient junction depth.

In this embodiment, it may be possible to form the first-conduction-type region 20 while activating the second-conduction-type region 30 through simple processes by performing activation heat treatment for the second-conduction-type region 30 during heat treatment for diffusion of first-conduction-type impurities present in the dopant layer 206 to form the first-conduction-type region 20.

Thus, heat treatment required for the first-conduction-type region 20 and second-conduction-type region 30 may be carried out once and, as such, process simplification may be achieved. For example, heat treatment temperature may be 900 to 1,100° C. (for example, 920 to 1,030° C.). The temperature limits are determined for suitable diffusion of the first-conduction-type dopant and suitable activation of the second-conduction-type dopant. Of course, the embodiment of the invention is not limited to the above-described conditions, and the heat treatment temperature may have various values.

The heat treatment may be carried out using nitrogen gas or the like in a high-temperature furnace. Of course, the embodiment of the invention is not limited to the above-described condition and, the equipment and gas for activation heat treatment may be varied.

In this embodiment, heat treatment for formation of the first-conduction-type region 20 and activation heat treatment for the second-conduction-type region 30 are simultaneously carried out and, as such, process simplification may be achieved. Of course, the embodiment of the invention is not limited to the above-described condition. Heat treatment for formation of the first-conduction-type region 20 and activation heat treatment for the second-conduction-type region 30 may be separately carried out. For example, the dopant layer 206 and first capping film 204 may be formed, and heat treatment for formation of the first-conduction-type region 20 may then be carried out after formation of the second-conduction-type region 30 and second capping film 202 and activation heat treatment for the second-conduction-type region 30. Alternatively, the second-conduction-type region 30 and second capping film 202 may be formed, and activation heat treatment for the second-conduction-type region 30 may then be carried out after formation of the dopant layer 206 and first capping film 204 and heat treatment for formation of the first-conduction-type region 20. In this instance, accordingly, activation heat treatment may be carried out at a temperature optimized for the second-conduction-type region 30 (that is, a temperature optimized for activation of the second-conduction-type dopant), and the first-conduction-type region 20 may be heat-treated at a temperature optimized for formation thereof (that is, a temperature optimized for diffusion or doping of the first-conduction-type dopant). Other variations may be possible.

Although the first-conduction-type region 20 is illustrated in the drawings as being formed by a doped region constituting a part of the semiconductor substrate 110, the embodiment of the invention is not limited thereto. That is, the first-conduction-type region 20 may be constituted by a semiconductor layer formed over the front surface of the semiconductor substrate 110 while being doped with the first-conduction-type dopant. In this instance, formation of the first-conduction-type region 20 may be achieved by forming a semiconductor layer over the front surface of the semiconductor substrate 110, forming the dopant layer 206 over the semiconductor layer, and then diffusing the first-conduction-type dopant of the dopant layer 206 into the semiconductor layer through heat treatment, to ion-implant the first-conduction-type dopant into the semiconductor layer. Other variations may be possible.

In addition, although formation of the first-conduction-type region 20 is illustrated in this embodiment as being achieved by forming the dopant layer 206 containing the first-conduction-type dopant, and then diffusing the first-conduction-type dopant in the dopant layer 206, the embodiment of the invention is not limited thereto. For example, the first-conduction-type region 20 may be formed through a thermal diffusion process in which gas containing the first-conduction-type dopant is supplied at a process temperature enabling thermal diffusion, to diffuse or dope the first-conduction-type dopant into the semiconductor substrate 110. In this instance, boron-containing gas (for example, $BBr_3$) may be used as the dopant-containing gas. Other variations may be possible.

Figure 5G:
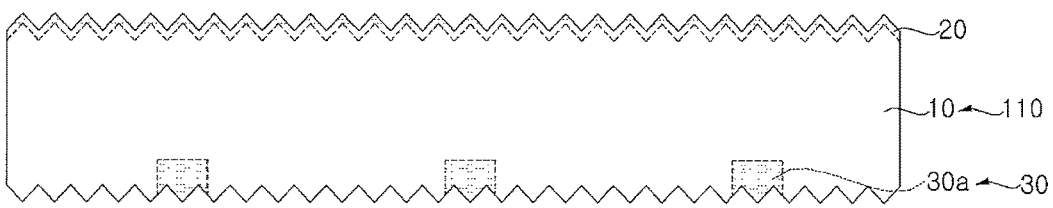

Thereafter, as illustrated in FIGS. 4 and 5G, in removal ST42, the dopant layer 206 and capping films 202 and 204 are removed. Removal of the dopant layer 206 and capping films 202 and 204 may be achieved using various methods. For example, the dopant layer 206 and capping films 202 and 204 are removed using diluted hydrogen fluoride (HF). Thus, formation of the first and second-conduction-type regions 20 and 30 may be completed.

Figure 5H:
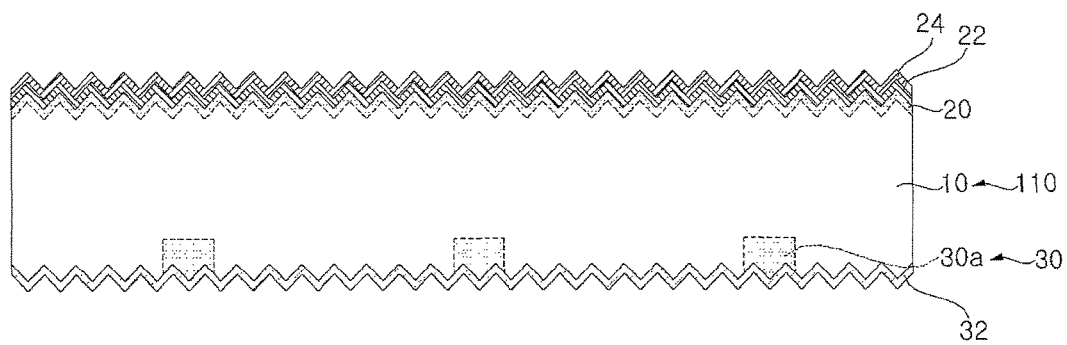

Subsequently, as illustrated in FIGS. 4 and 5H, in insulating film formation ST50, an insulating film is formed over the front surface of the semiconductor substrate 110 (or over the first-conduction-type region 20) and/or the back surface of the semiconductor substrate 110 (or over the second-conduction-type region 30).

In more detail, in this embodiment, the first passivation film 22 and anti-reflective film 24 are formed over the first-conduction-type region 20, and the second passivation film 32 is formed over the second-conduction-type region 30. Of course, the embodiment of the invention is not limited to the above-described structures. At least one of the first and second passivation films 22 and 32 and anti-reflective film 24 may only be formed.

Formation of the first passivation film 22, the anti-reflective film 24 and/or the second passivation film 32 may be achieved using various methods such as vacuum deposition, chemical vapor deposition, spin coating, screen printing, and spray coating.

Figure 5I:
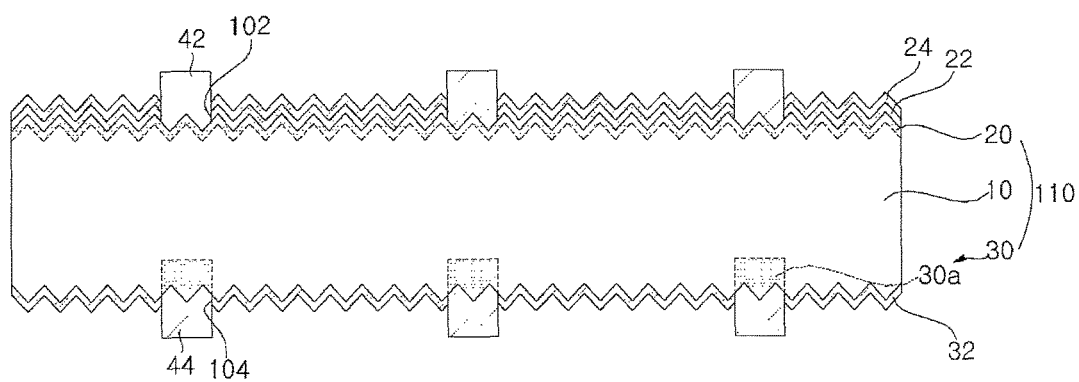

Thereafter, as illustrated in FIGS. 4 and 5I, in electrode formation ST60, the first and second electrodes 42 and 44 are formed to be connected to the first and second-conduction-type regions 20 and 30, respectively.

For example, the openings 102 are formed through the first passivation film 22 and anti-reflective film 24, and the openings 104 are formed through the second passivation film 32. Thereafter, a conductive layer is formed in the openings 102 and 104, using various methods such as plating and deposition, and, as such, the first and second electrodes 42 and 44 are formed.

In another example, the first and second electrodes 42 and 44 having the above-described structures may be formed by coating a paste for forming the first and second electrodes 42 and 44 over the first passivation film 22, the anti-reflective film 24 and/or the second passivation film 32, using screen printing, and then performing fire through or laser firing contact for the coated paste. In this instance, the openings 102 and 104 are formed in accordance with formation of the first and second electrodes 42 and 44 (in particular, during firing) and, as such, it is unnecessary to additionally perform a process for forming the openings 102 and 104.

In accordance with this embodiment, the second-conduction-type region 30 is formed through ion implantation, and the first-conduction-type region 20 is formed using a method different from that of the second-conduction-type region 30. Since no ion implantation is required for the first-conduction-type region 20, costs of ion implantation may be reduced. In addition, this method may be applied not only to the instance in which the second-conduction-type region 30 is formed throughout the semiconductor substrate 110, but also to the instance in which the second-conduction-type region 30 is locally formed. In this instance, the number of processes required for formation of the first and second-conduction type conductive regions 20 and 30 may be reduced because the first-conduction-type region 20 is formed through diffusion according to heat treatment. When heat treatment for formation of the first-conduction-type region 20 and activation heat treatment of the second-conduction-type region 30 are simultaneously carried out, the processes required therein may be further simplified.

In this instance, the dopant layer 206 for formation of the first-conduction-type region 20 may be formed after formation of the second-conduction-type region 30 through ion implantation and formation of the second capping film 204. Accordingly, it may be possible to prevent the first-conduction-type dopant or other impurities from being doped or introduced into the second-conduction-type region 30 during formation of the dopant layer 206.

The features, structures, effects, etc., as described above are included in at least one embodiment, and are not limited to a particular embodiment. In addition, although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a solar cell comprising:
   conductive region formation of forming a first-conduction-type region at one surface of a semiconductor substrate and a second-conduction-type region at another surface of the semiconductor substrate; and
   electrode formation of forming a first electrode connected to the first-conduction-type region and a second electrode connected to the second-conduction-type region,
   wherein, in the conductive region formation, the first-conduction-type region is formed by forming a dopant layer containing a first-conduction-type dopant over the one surface of the semiconductor substrate, and heat-treating the dopant layer, and the second-conduction-type region is formed by ion-implanting a second-conduction-type dopant into the semiconductor substrate at the another surface of the semiconductor substrate,
   wherein the conductive region formation comprises:
      forming the second-conduction-type region through the ion-implanting of the second-conduction-type dopant into the semiconductor substrate at the another surface of the semiconductor substrate;
      forming a capping film over the second-conduction-type region; and
      forming the dopant layer containing the first-conduction-type dopant over the one surface of the semiconductor substrate after the forming of the capping film,
   wherein the dopant layer is formed through deposition thereof, and
   wherein the forming of the capping film forms the capping film to contact the second-conduction-type region and the another surface of the semiconductor substrate.

2. The method according to claim 1, wherein the dopant layer comprises a glass silicate containing the first-conduction-type dopant.

3. The method according to claim 2, wherein:
   the semiconductor substrate has n-type conductivity; and
   the dopant layer comprises boron glass silicate (BSG).

4. The method according to claim 2, wherein the dopant layer has a thickness of 50 to 120 nm.

5. The method according to claim 1, wherein:
   the one surface and the another surface are respectively a front surface and a back surface of the semiconductor substrate;
   the first-conduction-type region is an emitter region formed at the front surface of the semiconductor substrate; and
   the second-conduction-type region is the back surface field region formed at a back surface of the semiconductor substrate.

6. The method according to claim 1, wherein:
   the one surface and the another surface are respectively a front surface and a back surface of the semiconductor substrate;
   the first-conduction-type region is formed at an entire portion of the front surface of the semiconductor substrate; and
   the second-conduction-type region has a local structure locally formed at the back surface of the semiconductor substrate.

7. The method according to claim 1, wherein:
   the first-conduction-type region has p-type conductivity; and
   the second-conduction-type region has n-type conductivity.

8. The method according to claim 1, wherein the conductive region formation further comprises:
   diffusing the first-conduction-type dopant through heat treatment, thereby forming the first-conduction-type region.

9. The method according to claim 8, wherein, in the heat treatment for the dopant layer, activation heat treatment for activation of the second-conduction-type dopant in the second-conduction-type region is carried out together with the heat treatment for the dopant layer.

10. The method according to claim 8, wherein the formation of the capping film and the formation of the dopant layer are carried out through an in-situ process.

11. The method according to claim 10, wherein the formation of the capping film and the formation of the dopant layer are carried out through atmospheric pressure chemical vapor deposition.

12. The method according to claim 10, wherein the formation of the capping film and the formation of the dopant layer are carried out using different materials, respectively, through change of a raw gas.

13. The method according to claim 10, wherein the formation of the capping film and the formation of the dopant layer are carried out at temperatures having a difference of 100° C. or less, respectively.

14. The method according to claim 10, wherein the capping film has a greater thickness than the dopant layer.

15. The method according to claim 10, wherein:
   the formation of the capping film is carried out using a raw gas comprising an oxygen gas and a silicon-containing gas; and
   the formation of the dopant layer is carried out using the oxygen gas, the silicon-containing gas, and a dopant-containing gas containing the first-conduction-type dopant.

16. The method according to claim 8, wherein the capping film has a thickness of 20 nm or more.

17. The method according to claim 8, wherein the capping film comprises a silicon oxide.

18. The method according to claim 8, further comprising:
   forming another capping film over the dopant layer between the formation of the dopant layer and the heat treatment.

19. The method according to claim 18, wherein the formation of the capping film, the formation of the dopant layer, and the formation of the another capping film are carried out in an in-situ process.

* * * * *